(12) United States Patent
Kang

(10) Patent No.: US 8,753,988 B2
(45) Date of Patent: Jun. 17, 2014

(54) STARTING MATERIAL FOR USE IN FORMING SILICON OXIDE FILM AND METHOD FOR FORMING SILICON OXIDE FILM USING SAME

(75) Inventor: Song Yun Kang, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 250 days.

(21) Appl. No.: 13/375,346

(22) PCT Filed: May 27, 2010

(86) PCT No.: PCT/JP2010/058984
§ 371 (c)(1),
(2), (4) Date: Nov. 30, 2011

(87) PCT Pub. No.: WO2010/140529
PCT Pub. Date: Dec. 9, 2010

(65) Prior Publication Data
US 2012/0071006 A1    Mar. 22, 2012

(30) Foreign Application Priority Data
Jun. 3, 2009    (JP) .................................. 2009-134278

(51) Int. Cl.
*H01L 21/316*    (2006.01)
*C07F 7/21*    (2006.01)
*C23C 16/40*    (2006.01)
*H01L 21/02*    (2006.01)

(52) U.S. Cl.
CPC ........ *C23C 16/402* (2013.01); *H01L 21/02126* (2013.01); *H01L 21/02271* (2013.01)
USPC ............ 438/788; 556/434; 556/436; 556/442

(58) Field of Classification Search
CPC ............ C23C 16/402; H01L 21/02126; H01L 21/02271
USPC ............................ 438/788; 556/434, 436, 442
See application file for complete search history.

(56) References Cited

U.S. PATENT DOCUMENTS

| 2,989,559 | A | * | 6/1961 | Marsden ........................ 556/436 |
| 5,789,516 | A |   | 8/1998 | Graiver et al. |
| 2008/0203574 | A1 | * | 8/2008 | Kobayashi et al. ........... 257/759 |

FOREIGN PATENT DOCUMENTS

| EP | 0870774 A2 | 10/1998 |
| JP | 10-279643 A | 10/1998 |
| JP | H10-279643 A | 10/1998 |
| JP | 2005-252012 A | 9/2005 |
| JP | 2007-042884 A | 2/2007 |
| JP | 2007-318067 A | 12/2007 |
| WO | 2007018268 A1 | 2/2007 |

OTHER PUBLICATIONS

International Search Report issued on Aug. 31, 2010 for WO2010/140529 A1.

* cited by examiner

*Primary Examiner* — Alexander Ghyka
(74) *Attorney, Agent, or Firm* — Abelman, Frayne & Schwab

(57) ABSTRACT

Disclosed is a starting material for use in forming a silicon oxide film on a substrate by the CVD method, comprising a siloxane compound having a carbonyl group, wherein the starting material is decomposed by applying energy, thereby releasing CO and producing a product having no dangling bond in the chemical structure, and the product contributes to the formation of the film. As a result, a silicon oxide film having a favorable step coverage is formed.

7 Claims, 5 Drawing Sheets

STARTING MATERIAL FOR USE IN FORMING SILICON OXIDE FILM AND METHOD FOR FORMING SILICON OXIDE FILM USING SAME

CROSS-REFERENCE TO RELATED APPLICATIONS

This application is a national phase of PCT application No. PCT/JP2010/058984, filed 27 May 2010, which claims priority to JP patent application No. 2009-134278, filed 3 Jun. 2009, all of which are incorporated herein by reference.

TECHNICAL FIELD

The present invention relates to a starting material for forming a silicon oxide film on a substrate by using a chemical vapor deposition (CVD) method, and a method for forming a silicon oxide film using the same.

BACKGROUND ART

In manufacturing of a semiconductor device, a silicon oxide film is mainly used as an interlayer insulation film. As a method for forming the silicon oxide film, there is known a method for forming the film by CVD by using TEOS (tetraethyl orthosilicate), which is an organic silane-based gas, and an oxidizing agent. Currently, a silicon oxide film having a good film quality has been formed by plasma CVD using TEOS, and in particular, a silicon film oxide film having the same film quality as the thermal oxide film can be obtained by microwave plasma CVD. Accordingly, it has been examined that this technology is also applied to a gate insulation film which has been considered difficult to be applied to the conventional CVD.

However, currently, in accordance with size reduction or high integration of the semiconductor device, there are increasing cases where the silicon oxide film is formed on a recessed portion having a high aspect ratio. And in the CVD using TEOS, since a step coverage is poor, there is a problem in that it is difficult to form a film on a recessed portion having a high aspect ratio.

As a technology for obtaining a favorable step coverage by CVD using TEOS, Japanese Patent Application Laid-Open No. 2007-42884 (Patent Document 1) suggests a method for forming a silicon oxide film, in which a target object is placed in a processing vessel, and TEOS gas, oxygen gas and hydrogen gas are introduced into the processing vessel, the TEOS gas is then adsorbed on the target object while decomposition of TEOS gas in a gas phase is suppressed by heating the processing vessel under the reduced pressure atmosphere at a temperature lower than the decomposition temperature of the TEOS gas, and then, the adsorbed TEOS is decomposed to form a silicon oxide film.

However, since the C—C bonds existing in TEOS tend to be broken and active dangling bonds tend to be remained, TEOS is inherently apt to be attached. Accordingly, even though the same method as in Patent Document 1 is adopted, there is a limit to improve the step coverage. Therefore, there is a need for a starting material capable of forming a silicon oxide film having a better step coverage by a CVD method.

DISCLOSURE OF INVENTION

An object of the present invention is to provide a starting material for forming a silicon oxide film, which can obtain a favorable step coverage when the silicon oxide film is formed on a substrate by a CVD method, and a method for forming a silicon oxide film using the starting material.

The present inventor has repeatedly examined to solve the above problem, and has found out the following (1) and (2) to accomplish the present invention.

(1) In order to form a silicon oxide film with a high step coverage in a recessed portion having a large aspect ratio, it is required to use a starting material having a low attachment coefficient for forming the film, that is, a starting material that is difficult to be attached.

(2) When the starting material for forming a film includes a siloxane-based compound having a carbonyl group, in which CO is released when film forming, and the product produced by releasing CO has no dangling bond in the chemical structure, the released CO covers the surface of the film to block a surface reaction, and at the same time, no active portion exists on the product, such that the product is stable, and accordingly, it is difficult for the product to be attached to the surface of the film.

The first aspect of the present invention provides a starting material for forming a silicon oxide film on a substrate by a chemical vapor deposition method, including a siloxane-based compound having a carbonyl group, in which the starting material is decomposed by applying energy, thereby releasing CO and producing a product having no dangling bond in the chemical structure, and hence, the product contributes to the formation of the film.

In the starting material according to the first aspect of the present invention, the starting material for forming the silicon oxide film may have a structure in which a carbonyl group is included in a portion of a cyclic siloxane backbone. Specifically, the starting material may have a structure in which a portion of Si constituting a cyclic siloxane is substituted by a carbonyl group. The starting material may have a structure in which a portion of O constituting a cyclic siloxane is substituted by a carbonyl group, a structure in which a portion between Si and O constituting a cyclic siloxane is intervened by a carbonyl group, or a structure in which an alkyl group is bonded via a carbonyl group to Si constituting a cyclic siloxane. Further, the starting material may have a structure in which a group having a carbonyl group is bonded to Si constituting a cyclic siloxane.

The second aspect of the present invention provides a method for forming a silicon oxide film, including disposing a target substrate in a processing vessel, introducing a starting material for forming a silicon oxide film of the first aspect and an oxidizing agent into the processing vessel, applying energy to the starting material of the silicon oxide film to release CO and to attach to a surface of the film, and forming the silicon oxide film on the target substrate by the reaction of the product having no dangling bond in the chemical structure produced by releasing CO and contributing to the formation of the film and the oxidizing agent.

In the apparatus for forming a film according to the second aspect of the present invention, the energy may be applied by producing plasma in the processing vessel. It is preferable that the plasma is produced by a microwave, and specifically, it is preferable that the plasma is produced by the microwave emitted from a plane antenna.

MODE FOR CARRYING OUT THE INVENTION

Hereinafter, exemplary embodiments of the present invention will be described in detail with reference to the accompanying drawings.

A starting material for forming a silicon oxide film according to an exemplary embodiment of the present invention is for forming the silicon oxide film on a substrate by a chemical vapor deposition (CVD) method.

In the CVD method, the silicon oxide film is formed on the substrate by disposing the target substrate in a processing vessel, supplying a starting material gas for forming the silicon oxide film and an oxidizing agent (e.g., $O_2$) in the processing vessel, and decomposing the starting material for forming the silicon oxide film by applying energy. The CVD may be a thermal CVD for decomposing the starting material gas for forming the silicon oxide film by heat energy, but in view of obtaining a favorable film quality, it is preferred to use a plasma CVD for decomposing the starting material for forming the silicon oxide film by plasma energy. Among plasma CVDs, microwave plasma CVD obtaining high plasma density at a low electronic temperature is preferable.

In the present invention, the starting material for forming the film includes a siloxane-based compound having a carbonyl group, wherein the material is decomposed by applying energy, thereby releasing CO and producing a product having no dangling bond in the chemical structure, and the product contributes to the formation of the film.

Figure 1:
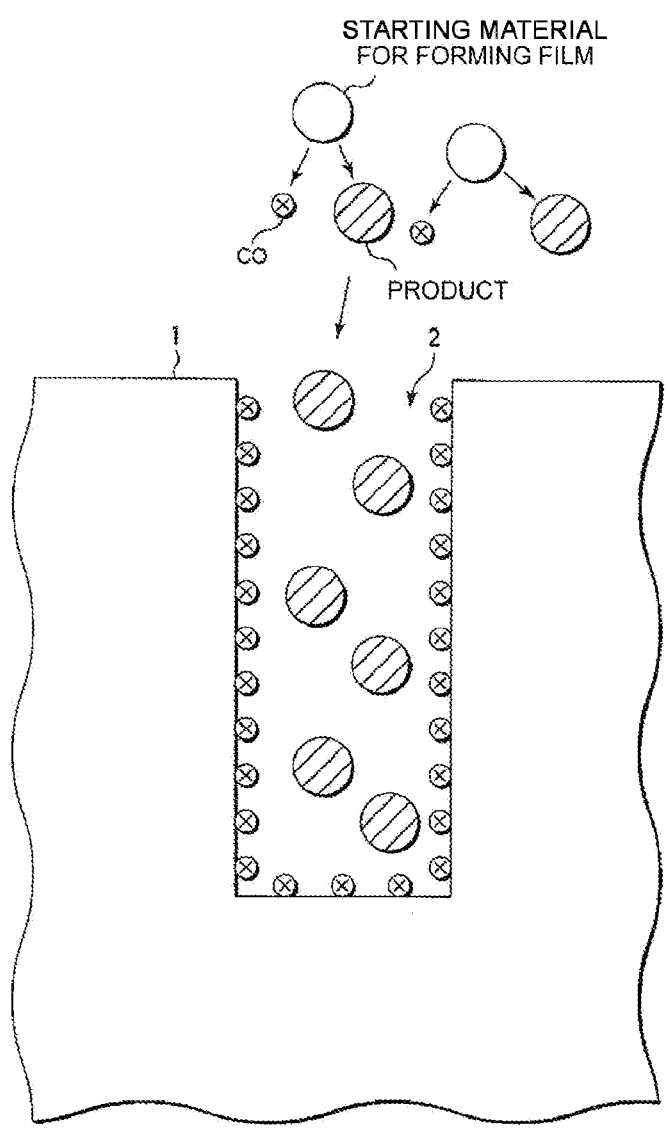
FIG. 1 is a schematic diagram illustrating a state when a film is formed by using a starting material for forming a silicon oxide film according to an exemplary embodiment of the present invention.

When using the compound, since the released CO covers the surface of the film to block a surface reaction, and at the same time, no active portion exists on the product contributing to the formation of the film produced by releasing CO, such that the product is stable, and accordingly, it is difficult for the product to be attached to the surface of the film. Accordingly, as shown in FIG. 1, even though there is a recess portion 2 having a high aspect ratio on a film surface 1, the surface reaction is blocked by CO on the surface of the inner wall in recess portion 2 and the product produced by releasing CO is a stable compound that has no active portion, such that the product is not attached to the wall of recess portion 2, enters into recess portion 2, and reacts with $O_2$ that is the oxidizing agent, thereby depositing the silicon oxide film. As described above, in the starting material for forming the film according to the exemplary embodiment of the present invention, since an attachment coefficient of the product contributing to the formation of the film and produced by releasing CO is low, the product also enters into recess portion 2 having a high aspect ratio, such that it is possible to form the silicon oxide film with a favorable step coverage.

In order to form the film with high coverage on the recess portion having the aspect ratio of 10, it has been reported that the theoretical attachment coefficient γ needs to be $2.5 \times 10^{-4}$ or less. However, in the case where a conventional TEOS is used as a starting material for forming the film, the C—C bond is preferentially broken by the applied energy. Therefore, the active dangling bond remains, and the attachment coefficient becomes large, such that $\gamma \leq 2.5 \times 10^{-4}$ required in the recess portion having the aspect ratio of 10 cannot be satisfied at all. Further, in the case where CO is simply released and just covers the surface of the inner wall of the recess portion and the dangling bond remains in the product, and in the case where no CO is released and no dangling bond exists in the decomposed product, the attachment coefficient may be decreased to some extent, but it is difficult to satisfy $\gamma \leq 2.5 \times 10^{-4}$. In this regard, in the starting material for forming the film according to the exemplary embodiment of the present invention, it is possible to form the silicon oxide film with a favorable step coverage by implementing a low attachment coefficient even though the aspect ratio is 10 or more, by both the surface blocking effect by CO and the effect in which the product is stable after CO is released.

As a detailed compound constituting the starting material for forming the silicon oxide film according to the exemplary embodiment of the present invention, it may be exemplified by a structure in which a carbonyl group is introduced into a portion of a cyclic siloxane backbone. For example, a structure in which a portion of O of a cyclic siloxane is substituted by a carbonyl group may be used, as shown in the following Formula (1):

[Formula 1]

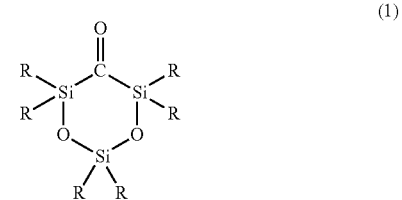

(1)

wherein, R represents an alkyl group such as a methyl group, an ethyl group, a propyl group or a butyl group. The number of carbon atoms of the alkyl group is preferably 1 to 4. Further, an example where the cyclic backbone is a trimer is shown in Formula (1), but the cyclic backbone may be tetramer or more. An example of the tetramer is shown in the following Formula (2):

[Formula 2]

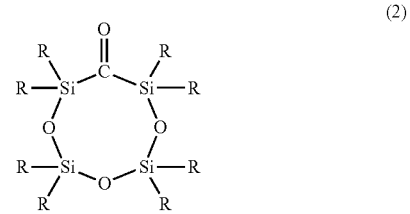

(2)

In Formula (1), the compound wherein R is a methyl group may be represented by Formula (3):

[Formula 3]

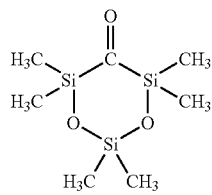
(3)

Figure 2:
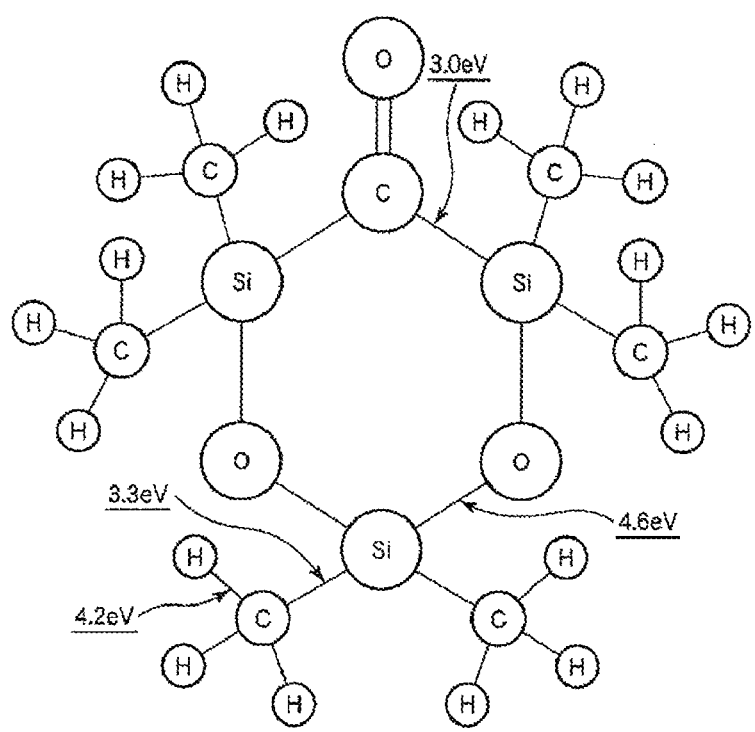
FIG. 2 is a schematic diagram illustrating a structural example of the starting material for forming the silicon oxide film according to the exemplary embodiment of the present invention and a bonding energy of a main portion thereof.
Figure 3:
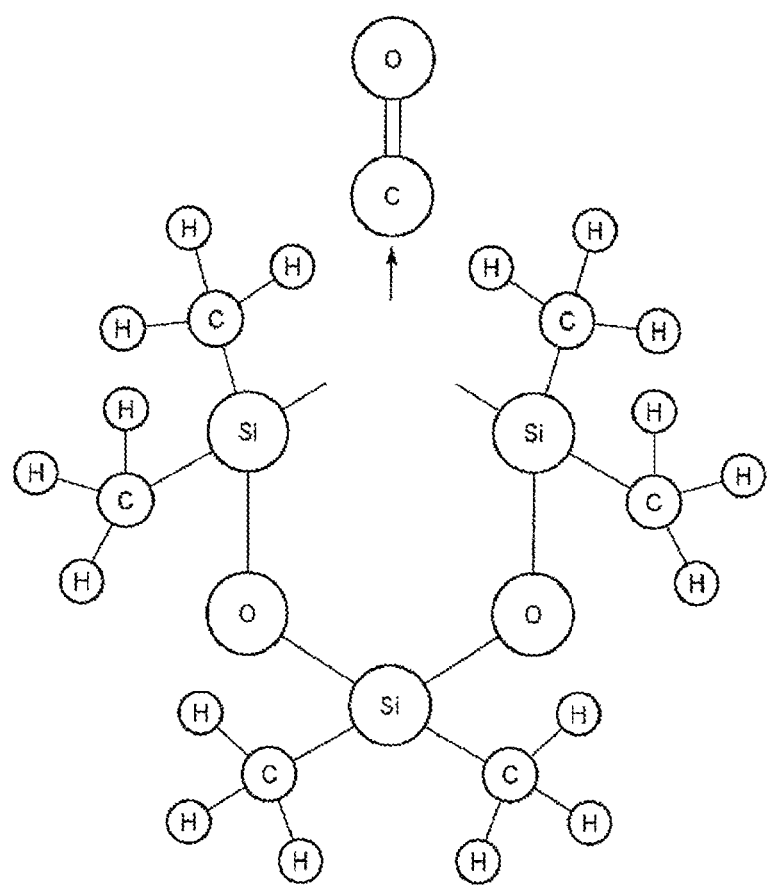
FIG. 3 is a schematic diagram illustrating a state in which CO is released from the starting material for forming the silicon oxide film of FIG. 2.

The bonding energy of each bond of the compound of Formula (3) is shown in FIG. 2. As shown in FIG. 2, the bonding energy between Si and C of the carbonyl group is 3.0 eV, the bonding energy between Si and O is 4.6 eV, the bonding energy between Si and C of the methyl group is 3.3 eV, and the bonding energy between C and H of the methyl group is 4.2 eV. Accordingly, since the bonding between Si and C of the carbonyl group having the smallest bonding energy is easily broken, CO is preferentially released as shown in FIG. 3. Further, after the release the product becomes a stable compound in which no dangling bond exists in the chemical structure, as shown in Formula (4):

[Formula 4]

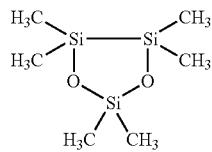
(4)

The number of the carbonyl groups is not limited to one per one molecule of the compound constituting the starting material for forming the film, but, for example, there may be two or three or more carbonyl groups, as shown in Formulae (5), (6) and (7):

[Formula 5]

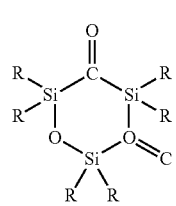
(5)

[Formula 6]

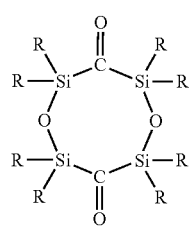
(6)

[Formula 7]

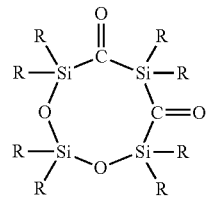
(7)

As the structure in which a carbonyl group is introduced into a portion of a cyclic siloxane backbone, it may be exemplified by a structure in which a portion of Si of a cyclic siloxane is substituted by a carbonyl group, as shown in Formula (8). In this case, since the bonding energy between C of the carbonyl group and O of the cyclic siloxane is 3.5 eV which is smaller than the bonding energy of other bonds, CO of the carbonyl group is preferentially released, and O and O are bonded after CO is released, thereby forming a stable compound in which no dangling bond exists in the chemical structure.

[Formula 8]

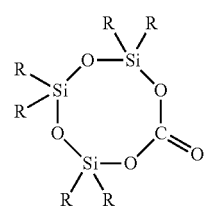
(8)

Further, as shown in Formula (9), a structure in which a carbonyl group is introduced between Si and O of a cyclic siloxane may be used. Even in this case, since the bonding energy between C of the carbonyl group and Si of the cyclic siloxane and the bonding energy of C of the carbonyl group and O of the cyclic siloxane are low as described above, CO of the carbonyl group is also preferentially released, and then, Si and O are bonded after CO is released, thereby forming a stable compound in which no dangling bond exists in the chemical structure.

[Formula 9]

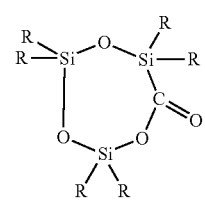
(9)

Further, as shown in Formula (10), a structure in which an alkyl group is bonded via a carbonyl group to Si constituting a cyclic siloxane may be used. Even in this case, since the bonding energy between C of the carbonyl group and Si of the cyclic siloxane is as low as 3.0 as described above, and the bonding energy between C of the carbonyl group and C of the alkyl group is as low as 3.4 eV, CO of the carbonyl group is preferentially released, and then, Si and the alkyl group are bonded after CO is released, thereby forming a stable compound in which no dangling bond exists in the chemical structure.

[Formula 10]

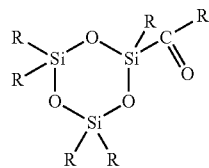

Further, as shown in Formula (11), a structure in which a group having a carbonyl group is bonded to Si constituting a cyclic siloxane may be used. Even in this case, CO of the carbonyl group is preferentially released, and C's are bonded to each other after the release, thereby forming a stable compound in which no dangling bond exists in the chemical structure.

[Formula 11]

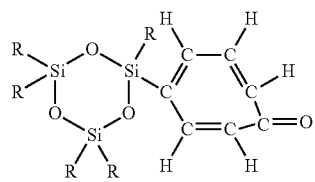

Meanwhile, in Formula (1), as examples where R is not the methyl group, examples where R is ethyl group or t-butyl group are shown in Formulae (12) and (13), respectively.

[Formula 12]

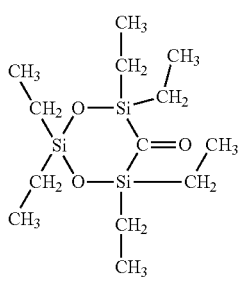

[Formula 13]

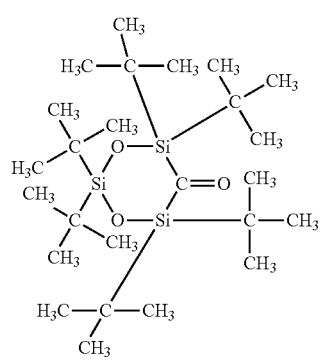

Figure 4:
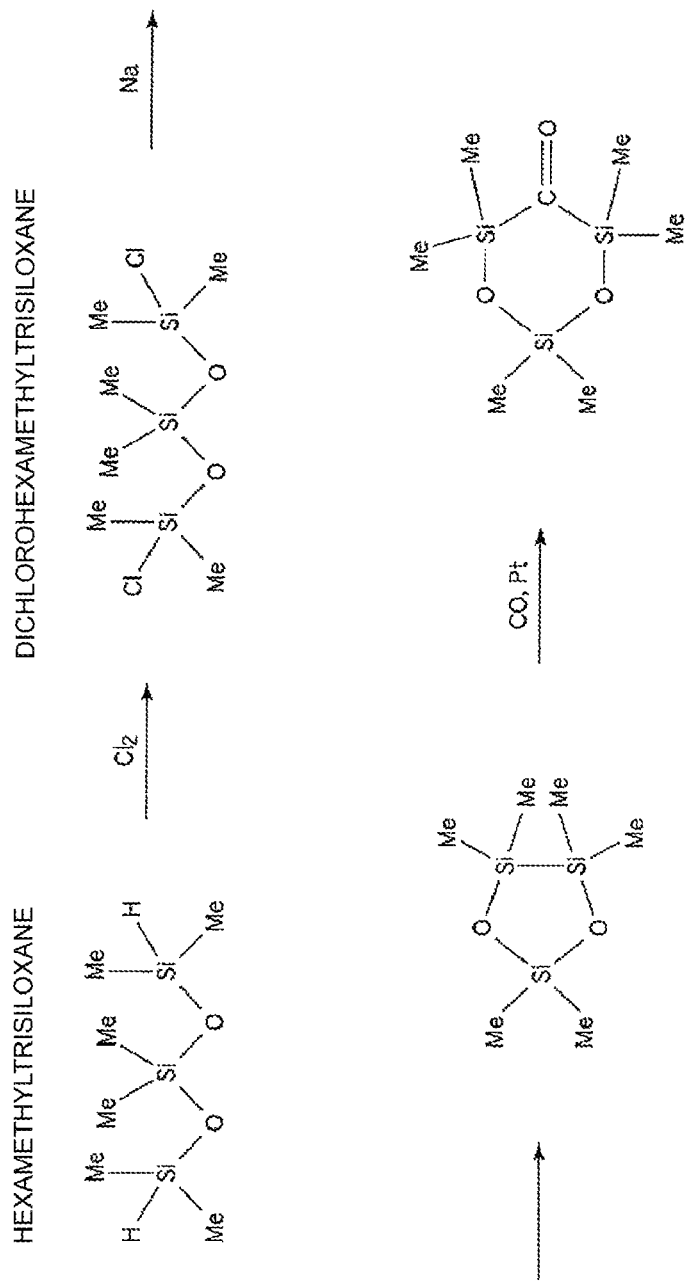
FIG. 4 is a view illustrating an example of a method for manufacturing the starting material for forming the silicon oxide film according to the exemplary embodiment of the present invention.

The compound constituting the starting material for forming the film according to the exemplary embodiment of the present invention may be prepared by performing a predetermined operation to an appropriate siloxane-based compound and then reacting CO therewith. For example, the compound shown in Formula (3) may be prepared by reacting $Cl_2$ with hexamethyltrisiloxane to form dichlorohexamethyltrisiloxane, dechlorinating with Na to bond the Si's to which Cl's were bonding, thereby forming a cyclic backbone, and then reacting CO by using a Pt catalyst, as shown in FIG. 4.

By forming a film by using the starting material for forming the film according to the exemplary embodiment of the present invention, the released CO covers the surface of the film to block a surface reaction, and at the same time, the product which contributes to the formation of the film produced by the releasing of CO does not have an active portion and is stable, and thus, it is difficult to attach the product to the surface of the film. Accordingly, even though the recess portion having a high aspect ratio exists on the surface of the film, the product is a stable compound in which an active portion does not exist because the surface reaction is blocked by CO on the surface of the inner wall in the recess portion, and on this account, the product is not attached to the wall of the recess portion but enters into the recess portion, such that the product reacts with $O_2$ that is the oxidizing agent, thereby depositing the silicon oxide film. Accordingly, it is possible to form a silicon oxide film with a favorable step coverage.

Subsequently, exemplary embodiments of a method for forming a silicon oxide film by CVD using a starting material for forming the silicon oxide film according to the present invention will be described.

Herein, as a CVD film forming apparatus, an example for forming a silicon oxide film by using an RLSA (radial line slot antenna) microwave plasma CVD film forming apparatus for producing plasma by introducing a microwave in a processing chamber by using an RLSA that is a plane antenna having a plurality of slots will be described.

Figure 5:
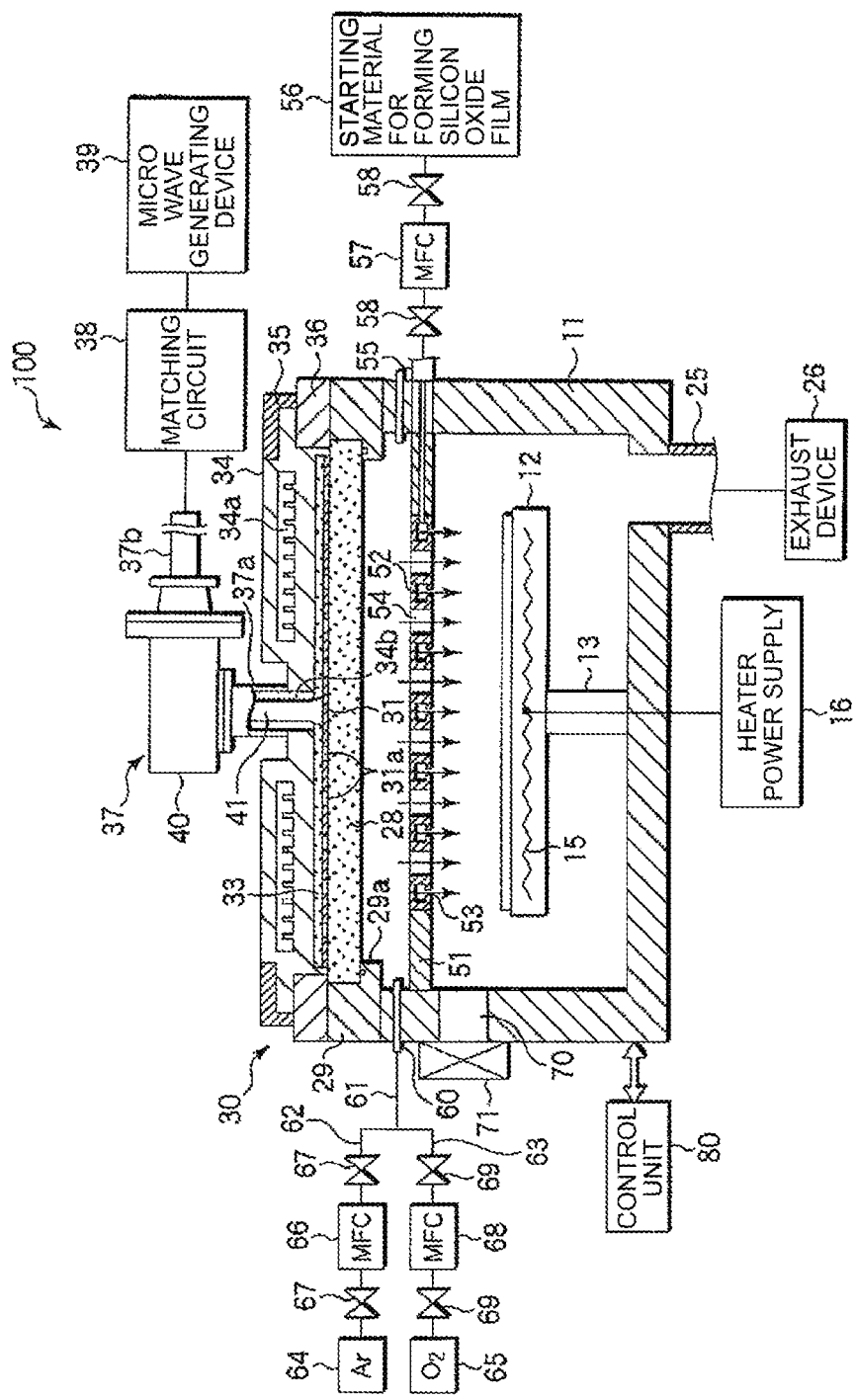
FIG. 5 is a cross-sectional view illustrating a device for processing RLSA microwave plasma in order to perform the method for forming the silicon oxide film according to the exemplary embodiment of the present invention.

FIG. 5 is a cross-sectional view illustrating such an RLSA microwave plasma CVD apparatus. A microwave plasma CVD film forming apparatus 100 has an approximately cylindrical grounded chamber (processing vessel) 11 air-tightly formed of metal material such as aluminum or stainless steel, and a silicon oxide film is formed on a semiconductor wafer W that is a target substrate (hereinafter, simply referred to as wafer) therein. A microwave introducing part 30 for introducing the microwave into the processing space is installed on an upper portion of chamber 11.

In chamber 11, a susceptor 12 for horizontally supporting wafer W, which is the target object, is installed while being supported by a support member 13 having a container shape vertically installed at the center of the bottom of chamber 11. A heater 15 for controlling a temperature is buried in susceptor 12. A power supply 16 for a heater is connected to heater 15, and heater 15 emits heat when receiving electricity from power supply 16, so that wafer W is heated to a predetermined temperature through susceptor 12. In susceptor 12, three lines of wafer support pins (not shown) for supporting and elevating wafer W are installed protrudably from the surface of susceptor 12.

An exhaust pipe 25 is connected to the bottom of chamber 11, and an exhaust device 26 including an automatic pressure control valve and a high speed vacuum pump is connected to exhaust pipe 25. Further, chamber 11 is exhausted by operating exhaust device 26, such that it is possible to reduce the pressure at a high speed to a predetermined vacuum degree in chamber 11. In addition, a carrying-in/out port 70 for carrying in and out wafer W and a gate valve 71 for closing and opening carrying-in/out port 70 are installed on a lateral wall of chamber 11.

Microwave introducing part 30 has a microwave transmittance plate 28, a plane antenna 31, and a wave-retardation member 33 in order from the susceptor 12. These are covered by a sealed member 34, a press ring 36 and an upper plate 29, and are fixed by an annular press ring 35. In a state in which microwave introducing part 30 is closed, an upper end of chamber 11 and upper plate 29 are sealed by a seal member (not shown), and as described below, are supported through microwave transmittance plate 28 by upper plate 29.

Microwave transmittance plate 28 is formed of a dielectric, for example, ceramics such as quartz, $Al_2O_3$, MN, sapphire and SiN, and acts as a microwave introducing window for introducing the microwave into the processing space of chamber 11 through transmittance of the microwave. A lower side (susceptor 12 side) of the microwave transmittance plate 28 may have a plane shape, but not limited thereto. For example, a recess portion or a groove may be formed therein in order to stabilize plasma by uniformizing the microwave. Microwave transmittance plate 28 is air-tightly supported through the seal member (not shown) by a protrusion 29a of an inner circumferential surface of upper plate 29 annularly disposed at a lower side of an external circumference of microwave introduction part 30. Accordingly, it is possible to air-tightly maintain the inside of chamber 11.

Since plane antenna 31 has a disc shape and is disposed on microwave transmittance plate 28, plane antenna 31 is fastened to the inner circumferential surface of sealed member 34. This plane antenna 31 is formed of a copper plate or an aluminum plate of which a surface is plated with, for example, gold or silver, and a plurality of slot holes 31a for emitting an electromagnetic wave such as the microwave are formed through in a predetermined pattern, thereby constituting RLSA.

Wave-retardation member 33 has dielectricity higher than the vacuum, and is installed on the upper side of plane antenna 31. Wave-retardation member 33 is constituted by, for example, a dielectric such as quartz, ceramics, a fluorine-based resin such as polytetrafluoroethylene or a polyimide-based resin, and has a function of controlling the plasma by shortening the wavelength of the microwave because the wavelength of the microwave becomes long in the vacuum. On the other hand, plane antenna 31 and microwave transmittance plate 28, or wave-retardation member 33 and plane antenna 31 may be stuck to or separated from each other.

Cooling water flow path 34a is formed in sealed member 34, and sealed member 34, wave-retardation member 33, plane antenna 31 and microwave transmittance plate 28 are cooled by allowing cooling water to flow therethrough. Meanwhile, sealed member 34 is grounded.

An opening 34b is formed at the center of sealed member 34, and a waveguide 37 is connected to opening 34b. A microwave generating device 39 is connected through a matching circuit 38 to the end of waveguide 37. With this, the microwave having the frequency of, for example, 2.45 GHz produced in microwave generation device 39 is transmitted through waveguide 37 to plane antenna 31. As the frequency of the microwave, 8.35 GHz and 1.98 GHz may be used.

Waveguide 37 has a coaxial waveguide 37a having a circular cross-section shape extending upwardly from opening 34b of sealed member 34, and a rectangular waveguide 37b extending horizontally and connected through a mode converter 40 to the upper end of coaxial waveguide 37a. Mode converter 40 between rectangular waveguide 37b and coaxial waveguide 37a has a function of converting the microwave transmitted in a TE mode into a TEM mode in rectangular waveguide 37b. An internal conductor 41 extends from the center of coaxial waveguide 37a and the lower end of internal conductor 41 is connected and fixed to the center of plane antenna member 31. Accordingly, the microwave is radially and efficiently transmitted uniformly through internal conductor 41 of coaxial waveguide 37a to plane antenna member 31.

A shower plate 51 for introducing the starting material gas for forming the silicon oxide film is installed horizontally between susceptor 12 and microwave introducing part 30 in chamber 11. Shower plate 51 includes a gas flow path 52 having a lattice shape and a plurality of gas discharge holes 53 formed in gas flow path 52, and a space portion 54 is formed between gas flow paths 52 having the lattice shape. A pipe 55 extending to the outside of chamber 11 is connected to gas flow path 52 of shower plate 51. A starting material gas supply source 56 for forming the silicon oxide film is connected to pipe 55. A mass flow controller 57 for controlling a flow rate and a pair of valves 58 installed before and after the mass flow controller, are provided in pipe 55. As the starting material gas for forming the silicon oxide film, the siloxane-based compound having the carbonyl group as described above is used. In the case where the starting material for forming the silicon oxide film is a liquid at a normal temperature, the starting material is supplied by vaporization using an appropriate method such as bubbling, heating and vaporizing by a vaporizer.

Meanwhile, a plasma gas introducing member 60 having a ring shape is installed at the upper side of shower plate 51 of chamber 11 along the chamber wall, and a plurality of gas discharge holes are formed on the internal circumference of plasma gas introducing member 60. A pipe 61 is connected to plasma gas introducing member 60 and is branched into an Ar gas pipe 62 and an $O_2$ gas pipe 63, and the pipes are connected to an Ar gas supply source 64 and an $O_2$ gas supply source 65, respectively. A mass flow controller 66 for controlling a flow rate and a pair of valves 67 installed before and after the mass flow controller are provided in Ar gas pipe 62. Further, a mass flow controller 68 for controlling a flow rate and a pair of valves 69 installed before and after the mass flow controller are provided in $O_2$ gas pipe 63. The Ar gas introduced into chamber 11 from Ar gas supply source 64 becomes plasma by a microwave introduced through microwave introducing part 30 into chamber 11, and this plasma converts the $O_2$ gas introduced from $O_2$ gas supply source 65 into chamber 11 into plasma, and at the same time, the plasma is applied to the starting material gas for forming the silicon oxide film discharged from gas discharge hole 53 of shower plate 51 through space portion 54 of shower plate 51.

Each constitution portion of microwave plasma CVD film forming apparatus 100 is controlled by a control unit 80. Control unit 80 is constituted by a computer, and connected to a controller (microprocessor) performing a operation processing, a keyboard for performing an input operation of a command in order for an operator to manage each constitution portion of microwave plasma CVD apparatus 100, a user interface formed of a display visualizing and displaying an operation situation of the apparatus 100, a control program for implementing various processing performed in microwave plasma CVD film forming apparatus 100 by the controller, and a memory unit storing a program, that is, a processing recipe for performing processing in each constitution portion of etching apparatus 100 according to the processing condition. The processing recipe is stored in a state where the recipe is stored in the memory medium. The memory medium may be a fixed-type medium such as a hard disk, or a movable medium such as a semiconductor memory, CD-ROM, and DVD. Further, the recipe may be appropriately transmitted from other devices, for example, through a dedicated communication line. In addition, if necessary, processing is performed in the microwave plasma CVD film forming apparatus 100 by executing the recipe in the controller upon calling for a predetermined recipe by a command from the user interface.

Subsequently, a method for forming a film according to the exemplary embodiment performed by using the microwave plasma CVD film forming apparatus 100 constituted as described above will be described.

First, susceptor 12 is heated to a predetermined temperature by heater 15, and wafer W is carried into chamber 11 and displaced on susceptor 12. In this state, gas is exhausted from chamber 11 so that pressure in chamber 11 becomes 1.33 to 1330 Pa (10 mTorr to 10 Torr) by heating wafer W to, for example, 100 to 400° C., and the microwave from microwave generating device 39 is induced through matching circuit 38 to waveguide 37 while Ar gas is introduced from Ar gas supply source 64 into chamber 11. The microwave then sequentially passes through rectangular waveguide 37b, mode converter 40, and coaxial waveguide 37a, and is applied to plane antenna 31 via internal conductor 41. The microwave is then emitted from slot hole 31a of plane antenna member 31 through microwave transmittance plate 28 into chamber 11. The microwave is transmitted in rectangular waveguide 37b in a TE mode, and the microwave in the TE mode is converted into a TEM mode in mode converter 40 and transmitted through coaxial waveguide 37a to plane antenna member 31, such that the microwave is emitted from plane antenna member 31 through transmittance plate 28 to chamber 11, and an electronic system is formed in chamber 11 by the microwave, such that Ar gas that is plasma producing gas is converted into plasma. Further, the $O_2$ gas introduced from $O_2$ gas supply source 65 into chamber 11 is converted into plasma by the Ar plasma, and at the same time, the plasma is applied to the starting material gas for forming the silicon oxide film discharged from gas discharge hole 53 of shower plate 51 through space portion 54 of shower plate 51.

As described above, since the starting material for forming the silicon oxide film includes a siloxane-based compound having a carbonyl group, in which the compound is decomposed by applying energy to release CO, and the product produced by releasing CO contributes to the formation of the film and has no dangling bond in the chemical structure, the product that contributes to the formation of the film after CO is released by plasma energy has no dangling bond in the chemical structure.

Accordingly, as shown in FIG. 1, even in the case where recess portion 2 having a high aspect ratio is formed on the surface of the film 1, since CO released from the starting material for forming the silicon oxide film covers the surface of the internal wall of recess portion 2 to block the surface reaction, and at the same time, the product after the release is a stable compound having no dangling bond that is an active portion, the product has a low attachment coefficient, such that the product is not attached to the internal wall of recess portion 2 but introduced into recess portion 2. Accordingly, the reaction between the product after the release and $O_2$ gas converted into the plasma occurs in recess portion 2 having a high aspect ratio, such that a silicon oxide film ($SiO_2$ film) is formed with a favorable step coverage.

The plasma which is generated when the film is formed has high density of about $1\times10^{10}$ to $5\times10^{12}/cm^3$ and also becomes low electronic temperature plasma of about 1.5 eV or less around wafer W by emitting the microwave from a plurality of slot holes 32 of plane antenna 31. Accordingly, a silicon oxide film having a favorable quality may be formed without damaging the base portion.

Meanwhile, the present invention is not limited to the above exemplary embodiments, but may be variously modified. For example, in the above exemplary embodiment, as an apparatus for forming a silicon oxide film, a RLSA microwave plasma CVD film forming apparatus is used, but the apparatus is not limited thereto, and other plasma CVD film forming apparatuses such as an inductively coupled plasma CVD film forming apparatus and a capacitively coupled (parallel flat plate) plasma CVD film forming apparatus may be used. And the apparatus is not limited to the plasma CVD film forming apparatus, but a thermal CVD film forming apparatus not using plasma energy but using only thermal energy may be used. Further, the oxidizing agent is not limited to $O_2$ gas, but other gases such as $H_2O$ and $O_3$ may be used. In addition, although Ar gas is used as plasma producing gas, other gas such as He may be used, and only starting material gas for forming the film and the oxidizing agent may be used without using the plasma producing gas.

Moreover, the target substrate is not limited to a semiconductor wafer, but other substrate such as, for example, a substrate for FPD represented by a substrate for liquid crystal display device may be used.

The invention claimed is:

1. A silicon oxide chemical vapor deposition (CVD) starting material for forming a silicon oxide film on a substrate comprising:
a siloxane-based compound having a carbonyl group,
wherein the silicon oxide CVD starting material has a structure in which the carbonyl group is introduced into a portion of a cyclic siloxane backbone, and is decomposed by applying energy to release CO and produce a product having no dangling bond in the chemical structure, and the product contributes to the formation of the silicon oxide film.

2. The starting material of claim 1, wherein the starting material has a structure in which a portion of Si constituting the cyclic siloxane is substituted by a carbonyl group.

3. The starting material of claim 1, wherein the starting material has a structure in which a portion of O constituting the cyclic siloxane is substituted by a carbonyl group.

4. The starting material of claim 1, wherein the starting material has a structure in which a carbonyl group is introduced in a portion between Si and O constituting the cyclic siloxane.

5. The starting material of claim 1, wherein the starting material has a structure in which an alkyl group is bonded via a carbonyl group to Si constituting the cyclic siloxane.

6. The starting material of claim 1, wherein the starting material has a structure in which a group having a carbonyl group is bonded to Si constituting the cyclic siloxane.

7. The starting material of claim 1, wherein the siloxane-based compound is prepared by reacting $Cl_2$ with hexamethyltrisiloxane to form dichlorohexamethyltrisiloxane, dechlorinating with Na to bond the Si's to which Cl's were bonding to form a cyclic backbone, and reacting CO using a Pt catalyst.

* * * * *